United States Patent [19]
Fukui

[11] Patent Number: 5,416,720
[45] Date of Patent: May 16, 1995

[54] METHOD AND APPARATUS FOR OPTIMIZING BLOCK SHAPE IN HIERARCHICAL IC DESIGN

[75] Inventor: Masahiro Fukui, Osaka, Japan

[73] Assignee: Matsushita Electric Industrial Co., Ltd., Osaka, Japan

[21] Appl. No.: 272,444

[22] Filed: Jul. 8, 1994

Related U.S. Application Data

[63] Continuation of Ser. No. 989,928, Dec. 11, 1992, abandoned, which is a continuation of Ser. No. 340,750, Apr. 20, 1989, abandoned.

[30] Foreign Application Priority Data

Apr. 21, 1988 [JP] Japan .................................. 63-98667
Oct. 24, 1988 [JP] Japan .................................. 63-267404

[51] Int. Cl.⁶ .................................................. G06F 15/60
[52] U.S. Cl. .................................... 364/489; 364/488
[58] Field of Search ................. 364/491, 490, 489, 488

[56] References Cited

U.S. PATENT DOCUMENTS

| | | | |
|---|---|---|---|
| 3,654,615 | 4/1972 | Freitag .................................. | 364/491 |
| 4,495,559 | 1/1985 | Gelatt et al. ........................ | 364/491 |
| 4,630,219 | 12/1986 | DiGiacomo et al. ............... | 364/488 |
| 4,686,629 | 8/1987 | Noti et al. ........................... | 364/491 |
| 4,815,003 | 3/1989 | Putatunda et al. ................. | 364/491 |
| 4,890,238 | 12/1989 | Klein et al. ......................... | 364/491 |

OTHER PUBLICATIONS

"Design Systems for VLSI Circuits: Logic Synthesis and Silicon Compilation"; Edited by G. De Micheli, A. Sangiovanni-Vincentelli & P. Antognetti; Martinus Nijhoff Publishers; pp. 130-193.

"An Algorithm to Eliminate All Complex Triangles in a Maximal Planar Graph for Use in VLSI Floor-Plan" by Shuji Tsukiyama et al; Proceedings of the IEEE International Symposium on Circuits and Systems, San Jose, California, May 5-7, 1986.

"A Block Interconnection Algorithm for Hierarchical Layout System" by Masahiro Fukui, et al; IEEE Transactions on Computer-AIDED Design vol. CAD-6, No. 3, May 1987.

Documents related to "Slicing"; pp. 138-150.

*Primary Examiner*—Vincent N. Trans
*Attorney, Agent, or Firm*—Lowe, Price, LeBlanc & Becker

[57] ABSTRACT

A whole process is divided into a rough floor plan and a detailed floor plan. In the rough floor plan, locations and shapes of blocks are roughly determined. In the detailed floor plan; an estimation of shapes of shape-variable blocks and sizes of wiring areas between blocks is simplified by listing all of slicing structures and optimizing block shapes for respective channel structures without greatly changing a block placement and pin locations. A combination of a hierarchical technique and a heuristic technique is used to allow block shapes to be optimized by selecting only suitable channel structures without listing all of an exponential number of the channel structures. In this way, the block shape optimization is simplified. The time spent in the simplified block shape optimization generally has a linear order with respect to the number of the blocks.

22 Claims, 9 Drawing Sheets

BLOCK NAME : FULALU
STATEMENT OF AREA ESTIMATION :
$X = 1960/R + 2 (\mu)$
$Y = 140*R + 43 (\mu)$

METHOD AND APPARATUS FOR OPTIMIZING BLOCK SHAPE IN HIERARCHICAL IC DESIGN

This application is a continuation of application Ser. No. 07/989,928 filed Dec. 11, 1992, which is a continuation of application Ser. No. 07/340,750, filed Apr. 20, 1989, both abandoned.

BACKGROUND OF THE INVENTION

This invention relates to a method and an apparatus for optimizing the placement and shape of blocks in a top down manner at an initial stage of the automatic layout design of a VLSI or an IC.

The following four methods are known. The first known method is to minimize the overlap between blocks, the wiring lengths, and the chip size by successively repeating the operation of moving the blocks toward each other, the operation of moving the blocks away from each other, and the operation of modifying the boundary shapes of the blocks. In the first known method, since only a single structure of the routing area or a single channel structure is estimated until the optimal combination of the block shape is determined, it tends to be difficult to attain acceptable optimization.

The second known method is to optimize the block shapes for each channel structure by expressing a given circuit in a graph, determining its plane drawing, and finally listing the rectangular dual graphs of the plane drawing which correspond to the respective channel structures. In cases where it is difficult to obtain the plane drawing directly from the graph, edges are deleted from the graph and vertices are added to the graph to derive the plane drawing of the graph. The second known method has the function of searching many channel structures on the basis of connections in the circuit expressed in the plane graph. In the second known method, the processing tends to be complicated and the number of the listed channel structures increases exponentially with the number of the blocks. In addition, since the placement of the blocks which are being processed is undetermined, it is difficult to estimate the wiring areas between the blocks.

In the third known method, the structure of the placement of blocks is represented by binary trees, and the placement conditions or the channel structures are searched through steps such as a step of exchanging the positions of adjacent blocks by changing the binary trees. The third known method includes a simulated annealing method (see U.S. Pat. No. 4,495,559) used in the search of the placement conditions. In the third known method, since a very large number of channel structures are listed and even ineffective channel structures are listed, the necessary calculation time tends to be long. In addition, since the placement of the blocks which are being processed is undetermined, it is difficult to estimate the wiring areas between the blocks.

The fourth known method includes a clustering method which is used to form a hierarchical structure in a bottom up manner to make a floor plan process hierarchical. After the hierarchical structure is formed, the template of the floor plan applied for each hierarchy level is searched in a top down manner to attain the optimization. The fourth known method resolves the problem of the third known method that the number of listed channel structures is very large. However, the fourth known method does not resolve the other problem of the third known method. In the fourth known method, since the resultant optimization greatly depends on the way of the clustering, the optimization in a top down manner tends to be difficult.

SUMMARY OF THE INVENTION

It is an object of this invention to provide an efficient method and an efficient apparatus for optimizing block shapes in hierarchical IC design.

This invention is directed to a method and an apparatus for efficiently optimizing a block placement, block shapes, and channel structures at an initial stage of the designing of a VLSI or an IC by use of a hierarchical placement and routing system.

One essential feature of this invention is an accurate estimation of shape of shape-variable blocks and sizes of wiring areas between blocks. In addition, this invention can optimize block shapes in a time having a linear order with respect to the number of the blocks. The feature and advantage resolve the problems of the prior art.

In order to attain the above-mentioned feature and advantage, this invention includes steps or means for performing the following processes.

Firstly, the whole process is divided into a rough floor plan and a detailed floor plan. In the rough floor plan, locations and shapes of blocks are roughly determined. In the detailed floor plan, an estimation of shapes of shape-variable blocks and sizes of wiring areas between blocks is simplified by listing all of slicing structures and optimizing block shapes for respective channel structures without greatly changing a block placement and pin locations.

Secondly, a combination of a hierarchical technique and a heuristic technique is used to allow block shapes to be optimized by selecting only suitable channel structures without listing all of an exponential number of the channel structures. In this way, the block shape optimization is simplified. The time spent in the simplified block shape optimization generally has a linear order with respect to the number of the blocks.

DESCRIPTION OF THE FIRST PREFERRED EMBODIMENT

Figure 12:
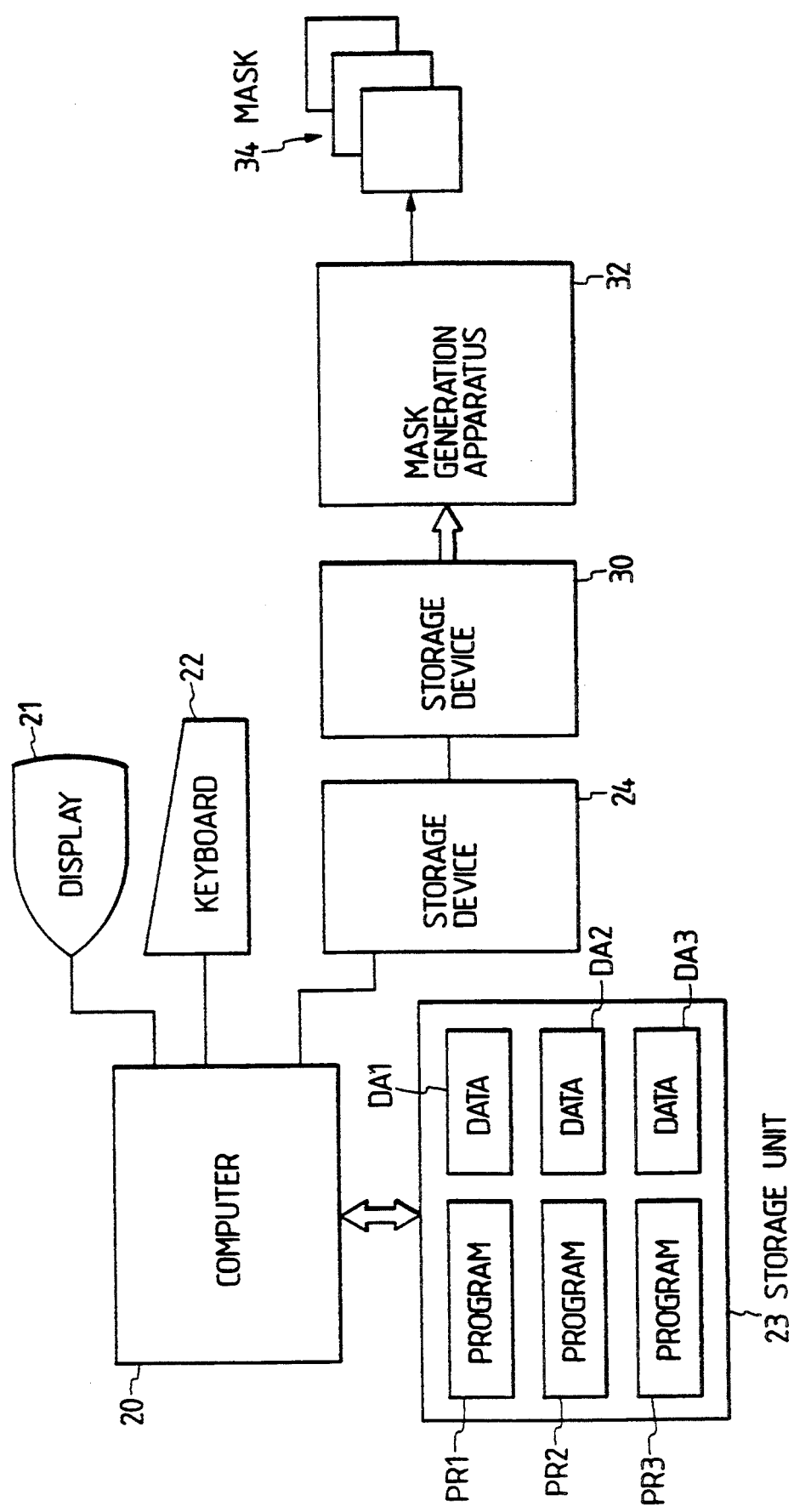
FIG. 12 is a diagram of a system including an apparatus of this invention.

With reference to FIG. 12, a CAD system for IC or VLSI design includes a computer 20. A graphic display terminal 21, a key board 22, and a suitable input device (not shown) such as a mouse tare connected to the computer 20. A storage unit 23 such as a hard disk unit is connected to the computer 20. A storage device 24 including a magnetic tape is connected to the computer 20.

The computer 20 operates in accordance with a set of programs PR1, PR2, and PR3 stored in the storage unit 23. The program PR1 relates to a floor planner. The program PR2 relates to a placer and router. The program PR3 relates to a mask pattern generator. The storage unit 23 holds data DA1, DA2, and DA3. The data DA1 relate to floor plan information such as a block placement, pin locations, and block shape. The data DA2 relate to geometrical information. The data DA3 relate to mask pattern information.

The computer 20 determines data of a target mask pattern on the basis of the data DA1, DA2, and DA3 by referring to the programs PR1, PR2, and PR3. The data of the target mask pattern are stored into the storage device 24.

The data of the target mask pattern are transmitted from the storage device 24 to a storage device 30 by an online data transfer or a magnetic tape transfer. The storage device 30 is connected to a known apparatus 32 for producing masks. The apparatus 32 prints the target mask pattern on a set of masks 34 in a known way. The set of the masks 34 is used in fabricating IC or VLSI chips in a known way.

Figure 4A:
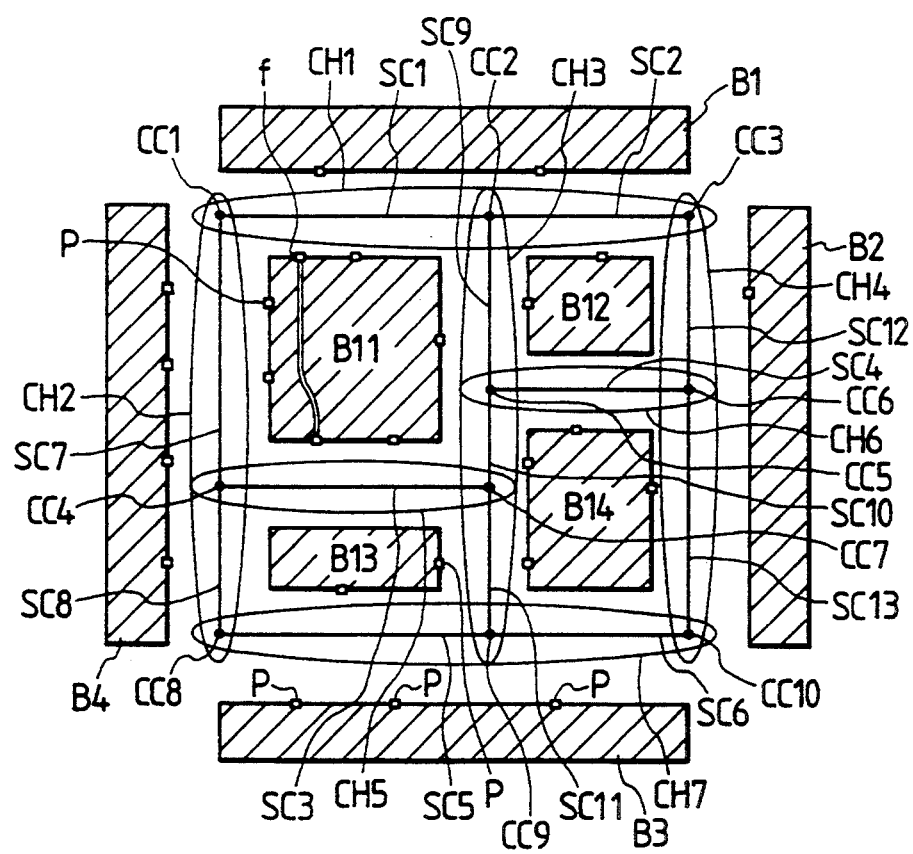
FIGS. 4(*a*), 4(*b*), and 4(*c*) are diagrams of a layout model.

A description will now be made of a model layout used in optimizing block shapes. As shown in FIG. 4(a), blocks B1–B4 corresponding input/output (I/O) ports are present along edges of a chip. Rectangular blocks B11–B14 of different shapes are present within a rectangle surrounded by the I/O blocks B1–B4. The blocks B11–B14 are of a shape-variable type and a shape-fixed type. In the variable-shape blocks, the locations of pins "p" and the locations and the number of feed through paths "f" can be set freely. In respect of the fixed-shape blocks, the block shapes, the pin locations, the feed through path locations, and others are fixed.

Strip-shaped wiring areas between adjacent blocks are sub channels SC1–SC13. The points where the sub channels SC1–SC13 intersect with each other are channel crosses CC1–CC10.

Figure 4B:
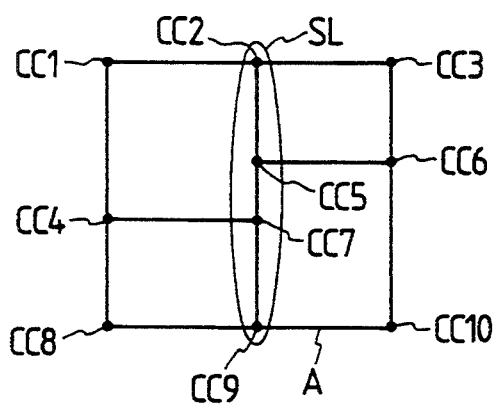

As shown in FIG. 4(b), a channel graph A is expressed by a combination of lines and vertices extending at opposite ends of the lines. The lines correspond to the sub channels SC1–SC13. The vertices correspond to the channel crosses CC1–CC10.

Figure 4C:
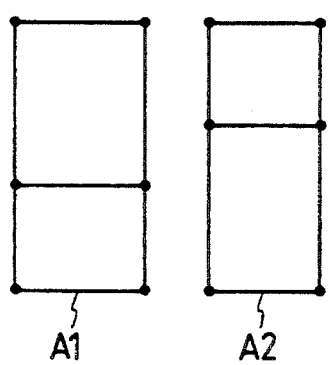

In respect of a given channel graph A, when there is a channel extending between upper and lower boundaries or between right-hand and left-hand boundaries of the channel graph, this channel is called "a slice SL". Slicing is dividing the channel graph A into two new channel graphs A1 and A2 with the slice SL as shown in FIG. 4(c). In cases where only a single block is included in each channel graph as a result of recursive execution of a process of dividing a channel graph into two new channel graphs through slicing, an original channel graph is defined as being sliceable. The structure of the channel which undergoes the slicing is referred to as a slicing structure.

A floor plan problem is to determine a placement of blocks, shape values, channel structures, a global route of each net, pin locations, and feed through path locations in order to minimize delays of critical nets and to minimize estimated chip size. The quality of a floor plan is estimated by factors such as a chip size which results from layout. At least part of this embodiment relates to the optimization of block shapes which is included in the processes of a floor plan executed by the program PR1 of FIG. 12.

Figure 1A:
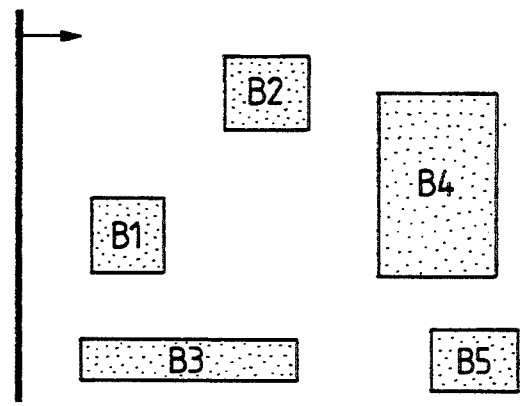
FIGS. 1(*a*), 1(*b*), and 1(*c*) are diagrams of area representation graphs.

This embodiment uses an area representation graph Gz in order to express the placement of blocks and to search channel structures. A sequence for forming an area representation graph Gz will be described hereinafter with reference to FIG. 1.

A set of blocks is represented by "B={b1, b2, ..., bk}. In an orthogonal coordinate system, intervals in the x direction which are occupied by respective blocks are represented by "X(bi)=(xmin(bi), xmax(bi))", while intervals in the y direction which are occupied by respective blocks are represented by "Y(bi)=(ymin(bi), ymax(bi))". A set of blocks which intersects straight line "X=x0" is represented by "S(x0)". The interval I in the x direction which is occupied by a chip is divided into a plurality of sequential non-overlapped intervals I1, I2, ..., in a manner such that the following conditions a) and b) are satisfied.

a) Two sets of blocks included in two adjacent intervals Ii and Ij in the x direction respectively are different from each other, and one of the two sets is not a subset of the other.

b) With respect to an arbitrary point "x" within an interval Ii in the x direction, a value x0 is present within the interval Ii and the value x0 is such that S(x)∈S(x0).

Next, the interval in the y direction which is occupied by the chip is similarly divided into a plurality of sequential non-overlapped intervals J1, J2, ..., Jn.

Next, the rectangular area occupied by the chip is divided into lattice areas with the previously-defined intervals Ii and Ji in the x direction and the y direction. Vertices of an area representation graph Gz are provided in correspondence with respective intersection points of the lattice areas. An edge or side line "e=(u, v)" is drawn between two vertices "u" and "v" in correspondence with the line between two intersection points "u" and "v" adjacent to each other in the vertical direction or the horizontal direction. The character "block(e)" represents a variable having a name of a block which passes across the line corresponding to each edge "e" of the graph Gz. When there is no block passing across the line, the variable "block(e)" is set as "block(e)=nil".

Figure 1B:
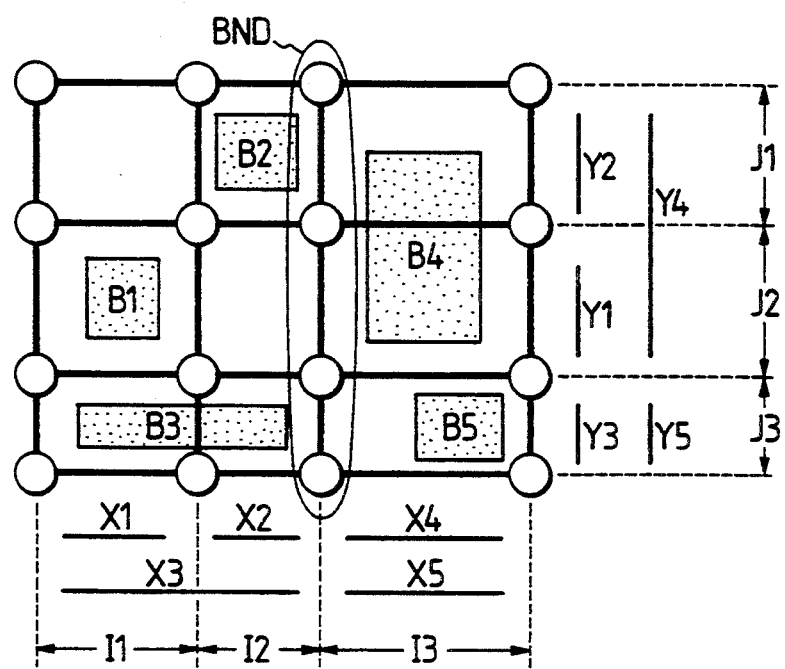
Figure 1C:
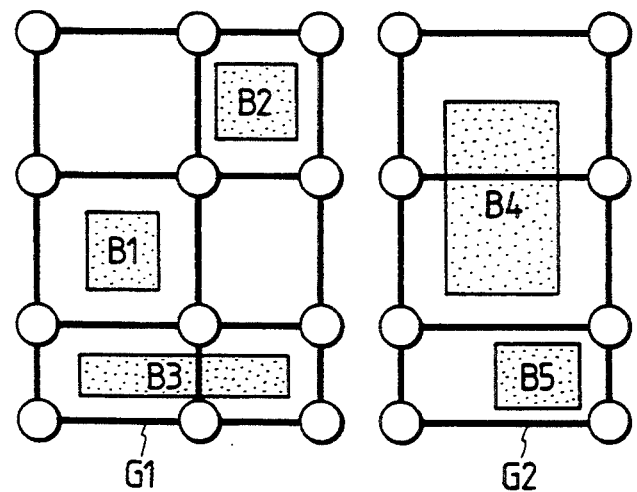

FIG. 1(b) shows an example of the block placement and the area representation graph Gz. A set of vertices which have the same x coordinate value on the area representation graph Gz, and sub graphs formed by edges between them are called "vertical cut lines BND". A set of vertices which have the same y coordinate value on the area representation graph Gz, and sub graphs formed by edges between them are called "horizontal cut lines". The cut line composed only of the edge "block(e)=nil" corresponds to a slice in a channel graph.

Figure 2A:
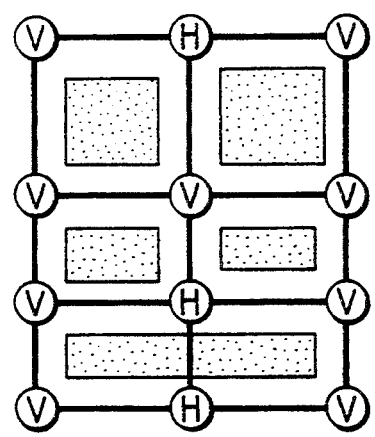
FIGS. 2(*a*) and 2(*b*) are diagrams in which channel structures are represented by labels D(v) of vertices of an area representation graph.
Figure 2B:
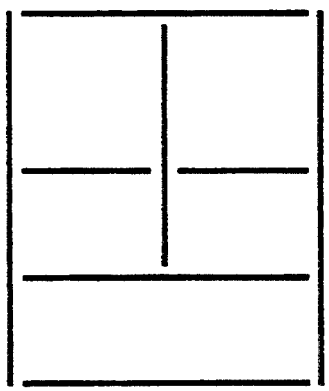

With respect to each vertex "v" of the graph Gz, the direction of a channel at a point corresponding to the vertex "v" is represented by the variable "D(v)". In the case where the direction of a channel is horizontal, the variable "D(v)" is set as D(v)="H". In the case where the direction of a channel is vertical, the variable "D(v)" is set as D(v)="V". In the case where the direction of a channel is undefined, the variable "D(v)" is set as D(v)=nil. Under initial conditions, the variable "D(v)" is set as D(v)=nil for every vertex. When the variable "D(v)" is defined as D(v)="V" or D(v)="H" for every vertex, one channel structure is expressed. FIG. 2 shows an example where labels D(v) are given for vertices of an area representation graph, and an example of a channel structure corresponding to the representation. As understood from the previous description, in cases where an area representation graph has an "n" number of vertices, the number of channel structures which can be defined equals the value "$2^n$".

A block shape optimization method of this embodiment will be described hereinafter with reference to FIG. 3 which is a flowchart of a program included in the program PR1 of FIG. 12. This embodiment includes operation 1 for a block placement (a block placement phase), operation 2 for generating proposed block shapes (a block shape estimation phase), operation 3 for expanding a block placement (an expansion of block placement), operation 4 for listing channel structures (a channel structure listing phase), operation 5 for optimizing block shapes (a block shape optimization phase), and operation 6 for pin placement (a pin placement phase). These operations or phases 1-6 are performed or executed by the computer 20 of FIG. 12 and the contents of the storage unit 23. Examples of the processes executed during the operations or phases 1-6 are described hereinafter.

Block Placement Phase 1

Blocks are placed on a chip in consideration of wiring lengths of critical nets and chip size, and rough estimates shape of the respective blocks are determined. At this stage, it is unnecessary for each block to take a rectangular shape. Since the area of a standard cell type block depends on pin placement, rough estimation of pin locations are made at this stage. When it is impossible to estimate rough locations for the pins, the process of the pin placement operation 6 is performed subsequently.

Block Shape Estimation Phase 2

Next, with respect to each block, a determination is made as to proposed shapes of the block which can be taken when the block is rectangular. A description will be made hereinafter on means for generating an estimative equation of the variation in shape of a standard cell type block in which a shape and pin locations can be selected freely.

Since the shape of a standard cell type block has a close relation with the number of cell rows R, the shape is represented by a function of the cell rows R while the width X and the height Y of the block are estimated by the following equations which include parameters "a", "b", "c", and "d".

$$Y = a*R + b$$

$$X = c/R + d$$

The parameters "a", "b", "c", and "d" are determined in accordance with the previously-mentioned estimative equations and a result (the height Y, the width X) of actual placement and wiring with respect to two or more different cell rows R.

In the case where the placement and the wiring are performed only once, the parameters "b" and "d" are determined by use of empirical values while the parameters "a" and "c" are determined by use of the previously-mentioned estimative equations and the result of the placement and the wiring. In the case where the placement and the wiring are not performed, the parameters "a", "b", "c", and "d" are estimated on the basis of various values such as the number of cells, the height of the standard cell, and the sum of cell widths.

Figure 5:
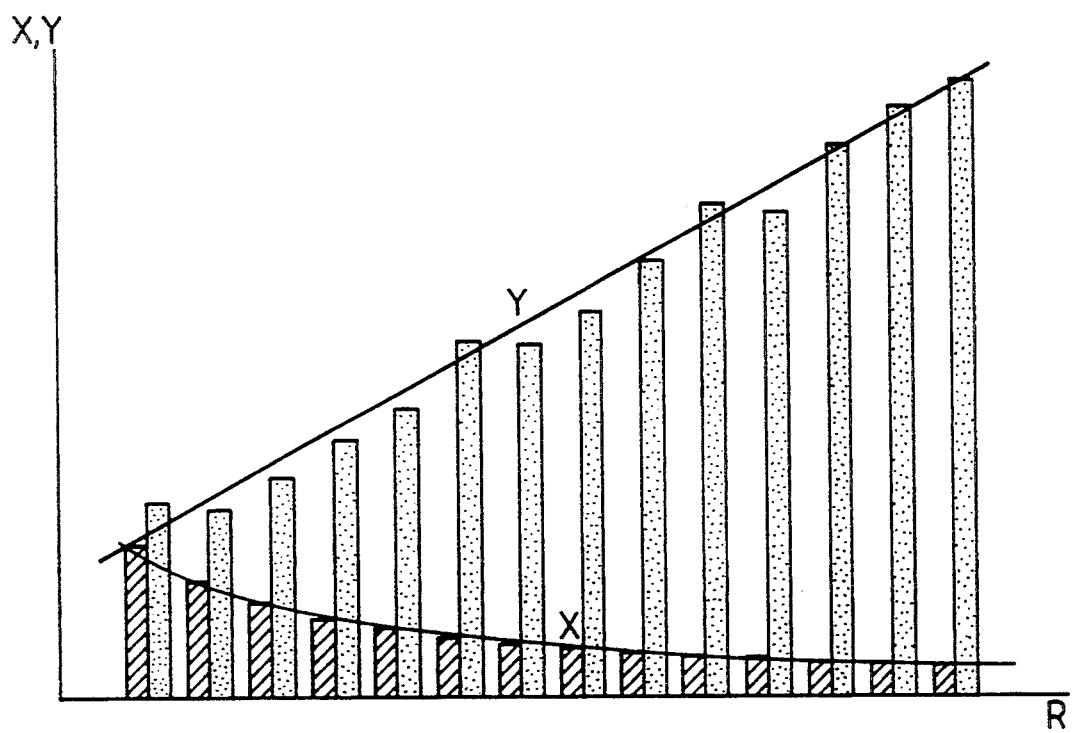
FIG. 5 is a diagram showing relationships between cell rows R, a height Y, and a width X of a variable-shape block.

In FIG. 5 is shown an example in which the block width X and the block height Y are plotted in connection with a result of actual placement and wiring which are performed under conditions where the number of the cell rows R is varied while the pin positions relative to the block remains fixed. It is understood from FIG. 5 that the use of the previously-mentioned estimative equations allows an accurate estimation of block shapes.

Expansion of Block Placement 3

Figure 6:
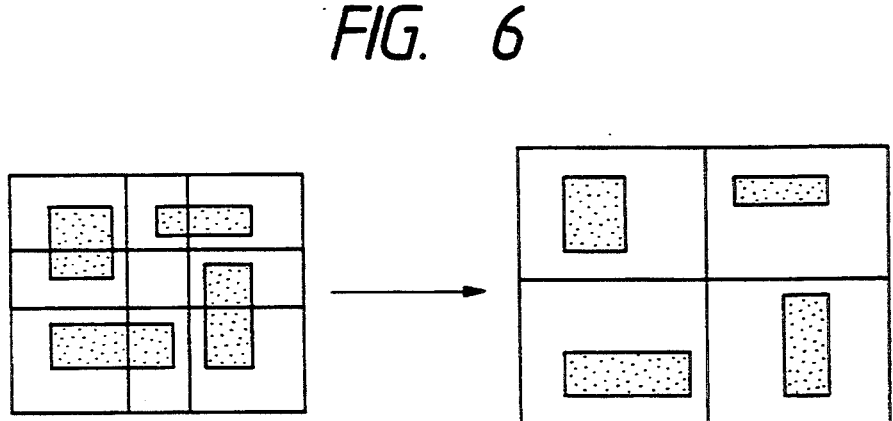
FIG. 6 is a diagram showing an expansion of a block placement.

Next, with respect to each block, the shape which is the closest to the shape determined in the block placement phase 1 is selected from the proposed shapes. The selected shapes are applied to the corresponding blocks on the chip. Subsequently, the placement of the blocks is moved from the origin, i.e., center O on the chip so that the distance between each block and the center of the chip is increased by a factor "a" (a>1). In FIG. 6 is shown an example of the placement expansion.

Firstly, the block placement is expanded until the overlaps between the blocks disappear. Secondly, the block placement is expanded until slicing channel structures are obtained. Thirdly, if necessary, the block displacement is expanded in accordance with the degree of expansion which is set from the exterior.

A description will be made hereinafter on a procedure Expnd which determines a coefficient "a" of the block placement expansion for obtaining slicing channel structures. FIG. 6 shows an example of the process of the procedure Expnd.

In the EXPND procedure, A is a rectangular area where all blocks are placed. Gz is an area representation graph based on the placement of blocks in area A. A* and G are a rectangle area and a graph, initially A*=A and G=Gz. The initial value of "a" is 1.0.

```
Procedure EXPND(A*, G, a)
begin;
  If more than one block is included in the area A*; do follows;
    If there are no slices on the graph G,
      Let a = a * b ( b = 1.1 );
      Assuming that chip and each block are located at (X0,Y0) and
      (Xi,Yi), respectively, move each block to a location
      (X0+(Xi−X0)*b, Y0+(Yi−Y0) *b);
      Reconstruct the graph G;
    or else;
      For all slices S on the graph G do follows;
        Divide the area A* by the slice S into areas A1 and A2;
        Let graphs G1 and G2 be sub graphs of Gz, each of which
        represents the block placement in A1 and A2, respectively;
        Invoke Expnd(A1, G1, a);
        Invoke Expnd(A2, G2, a);
    end if;
  end if;
end;
```

Channel Structure Listing Phase 4

Slicing structures are obtained from a set of slices which are used in repeating the operation of fining a cut line able to be a slice on the area representation graph Gz, and the operation of dividing the graph Gz with the cut line. A procedure "LIST_STRUCTURE" lists all of slicing structures by listing divisions of cases of taking a cut line corresponding to a slice.

In the procedure LIST_STRUCTURE, A is a rectangle area where all blocks are placed. Gz is an area representation graph based on the placement of blocks in area A. A* and G are a rectangle area and a graph, initially A*=A and G=Gz. STR_LST is a list of slicing structures. Initial state of the list STR_LST is empty.

---

Procedure LIST_STRUCTURE(A*, G)
begin;
   If more than one block is included in the area A*, do follows;
      Invoke LIST_STRUCTURE_V(A*, G);
      Invoke LIST_STRUCTURE_H(A*, G);
end;
;
Procedure LIST_STRUCTURE_V(A*, G)
begin;
   Search vertical slices S from left to right on the graph G;
   Divide the area A* by the slice S into right area A1 and left area A2;
   Let graphs G1 and G2 be sub graphs of Gz, each of which represents the block placement in A1 and A2, respectively;
   For all vertices v on the slice S, if D(v) = nil then let D(v) = 'V';
   If D(v) of all vertices v on graph Gz is denoted 'V' or 'H,' put the slicing structure defined by D(v)'s into the list STR_LST;
   Invoke LST_STRUCTURE(A1, G1);
   Invoke LST_STRUCTURE_H(A2, G2);
   For all vertices v on the slice S other than both sides of S, let D(v) = nil;
end;
Procedure LIST_STRUCTURE_H(A*, G)
begin;
   Search horizontal slices S from lower to upper on the graph G;
   Divide the area A* by the slice S into the upper area A1 and the lower one A2;
   Let graphs G1 and G2 be sub graphs of Gz, each of which represents the block placement in A1 and A2, respectively;
   For all vertices v on the slice S, if D(v) = nil, let D(v) = 'H';
   If D(v) of all vertices v on graph Gz is denoted 'V' or 'H,' put a slicing structure defined by D(v)'s into the list STR_LST;
   Invoke LST_STRUCTURE(A1, G1);
   Invoke LST_STRUCTURE_V(A2, G2);
   For all vertices v on the slice S other than both side of S, let D(v) = nil;
end;

---

Figure 7:
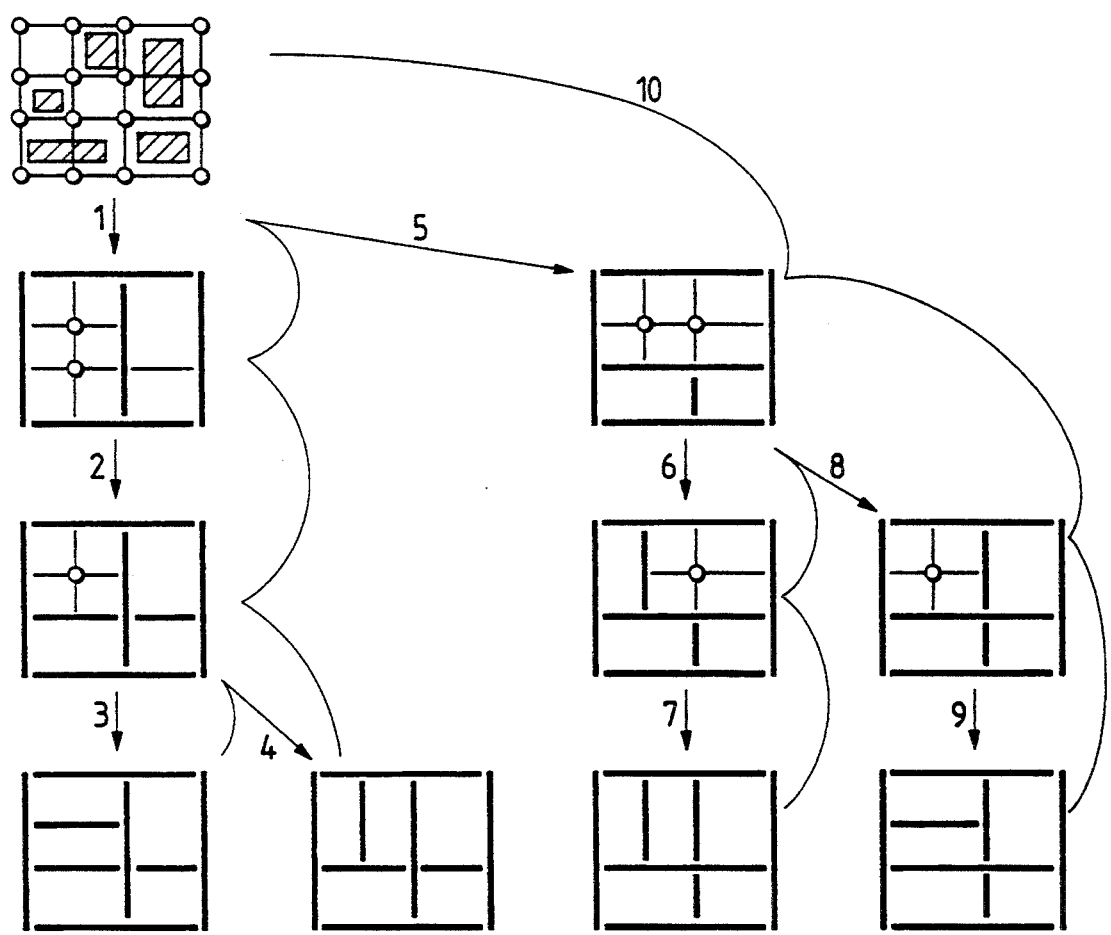
FIG. 7 is a diagram showing listing of channel structures.

FIG. 7 shows an example of a LST_STRUCTURE process flow. It is understood from FIG. 7 that channel structures are listed by a depth first search of slices. The depth of this search is the number of blocks. The width of this search is the number of slices at each phase.

Block Shape Optimization Phase 5

In cases where channel structures C are defined for a plurality of blocks b1, b2, ..., bk and where each block bi can take a plurality of shapes (Xi1,Yi1), (Xi2,Yi2), ..., (Xin,Yin), the character R(C,F) is used to represent the relation between the shape "F=(XAJ,YAj)" of a rectangle A enclosing all of the blocks b1, b2, ..., bk and the shapes to be taken by the respective blocks to realize the shape of the rectangle.

Among sets FA having components formed by shapes which can be taken by the rectangle A, the character FA* denotes the set which is maximal and which satisfies the condition that, for two arbitrary shapes (XAi,YAi) and (XAJ,YAj), if XAi<XAj, YAi>YAj. The character R*(C) denotes the previously-mentioned shape relation for arbitrary shapes included in the set FA*.

A procedure BS_OPT of the block shape optimization phase 5 is determined in the following sequence.

Procedure BS OPT

1: Determine the previously-mentioned set FA* related to the shape of the rectangle enclosing all of the blocks in the chip, and the shape relation R*(C).
2: Select one shape from the shapes included in the set FA on the basis of usefulness specifications such as size minimization, and determine the shape of each block by use of the relation corresponding to the selected shape.

In this phase, it can be thought that channel structures are provided with slicing structures. A procedure CNSTRCT_SL_R(C,A) for determining the set FA* and the shape relation R*(C) in the case of slicing structures will be described hereinafter. It is assumed that before the procedure CNSTRCT_SL_R(C,A) is performed, a determination is made as to the width necessary for wiring respective channels by use of a procedure of global wiring between blocks (see M. Fukui, et al., "A block interconnection algorithm for hierarchical layout system", IEEE tans. on Computer-Aided Design, Vol. CAD-6, No. 3, pp. 383–391, May 1987, which is referred to as the documents 1).

Procedure CNSTRCT SL R(C,A)

1: Find a slice "s" on the area A in which blocks are placed. In the absence of a slice "s" (in the case where only a single block is included in the area A), execute the following step 2. In other cases, execute a later step 3.
2: When a block bi included in the area A can take a plurality of shapes (Xi1,Yi1), (Xi2,Yi2), ..., (Xin,Yin), let the set FA*(A) be FA*(A)={(Xi1,Yi1), (Xi2,Yi2), ..., (Xin,Yin)}.
Since the number of a block "b" contained in the area A equals 1, set the shape relation R(C,F) related to each shape F in the set FA*(A) as R(C,F)={b=F}.
3: Divide the area A into two parts A1 and A2 with the slice "s".
3.1: Call CNSTRCT_SL_R(C,A1) and CNSTRCT_SL_R(C,A1).
3.2: In the case where the slice "s" is in the horizontal direction, give the set FA*(A) by use of the following equations (1)–(5) on the basis of the sets of the shapes of the areas A1 and A2 as FA*(A1)={$(x_{11},y_{11})$, $(x_{12},y_{12})$, ..., $(x_{1n},y_{1n})$} and FA*(A2)={$(x_{21},y_{21})$, $(x_{22},y_{22})$, ..., $(x_{2n},y_{2n})$}. The character "w" denotes the width necessary for wiring of channels corresponding to the slice "s".

$$FA^*(A) = FA^*(A1)' + FA^*(A2)' \qquad (1)$$

$$FA^*(A1) = \{(x_{11},y_{11}), (x_{12},y_{12}), \ldots, (x_{1n},\, y_{1n})\} \qquad (2)$$

$$FA^*(A2)' = \{(x_{21},y_{21}'), (x_{22},y_{22}'), \ldots, (x_{2n},\, y_{2n}')\} \text{(tm 3)}$$

$$y_{11}' = y_{11} + \min_{j:x_{2j}<x_{11}}(y_{2j}) + w \qquad (4)$$

$$y_{21}' = y_{2i} + \min_{j:x_{1j}<x_{2i}}(y_{1j}) + w \qquad (5)$$

In the case where the slice "s" is in the vertical direction, give the set FA*(A) by use of the following equations (11)–(15).

$$FA^*(A) = FA^*(A1)' + FA^*(A2)' \qquad (11)$$

$$FA^*(A1)' = \{(x_{11}', y_{11}), (x_{12}', y_{12}), \ldots, (x_{1n}', y_{1n})\} \quad (12)$$

$$FA^*(A2)' = \{(x_{21}', y_{21}), (x_{22}', y_{22}), \ldots, (x_{2n}', y_{2n})\} \quad (13)$$

$$x_{11}' = x_{1i} + \min_{j: y_{2j} < y_{1i}}(x_{2j}) + w \quad (14)$$

$$x_{21}' = x_{2i} + \min_{j: y_{1j} < y_{2i}}(x_{1j}) + w \quad (15)$$

3.2: Set the shape relations R(C,Fi1) related to the respective shapes Fi1 in the set FA*(A1) as R(C,Fi1)=(b11=Fi11, b21=Fi12, ..., bk1=Fi1k). Set the shape relations R(C,Fi2) related to the respective shapes Fi2 in the set FA*(A2) as R(C,Fi2)={b12=Fi21, b22=Fi22, ..., b12=Fi21}. At this time, determine the shape relations R(C,Fi) related to the respective shapes Fi in the set FA*(A) by use of R(C,Fi1)={b11=Fi11, b21=Fi12, ..., bk1=Fi1k, b12=Fi21, b22=Fi22,..., b12=Fi21) in the case where the shapes Fi are formed by adjacent connection between the shapes Fi1 in the area A1 and the shapes Fi2 in the area A2.

Pin Placement Phase 6

The pin placement phase 6 optimizes the pin placement to attain the following objects.
1) Minimization of the length of wiring.
2) Optimization of the number and the positions of feed through paths.
3) Prevention of the concentration of pins on a local area.

The pin placement phase 6 includes two stages. During an initial placement, only the minimization 1) and the optimization 2) are considered while the placement of pins is determined. Subsequently, during an improvement of the placement, the pins are moved to locations around the pin locations determined during the initial placement so that the density of the pin placement is reduced.

Figure 8A:
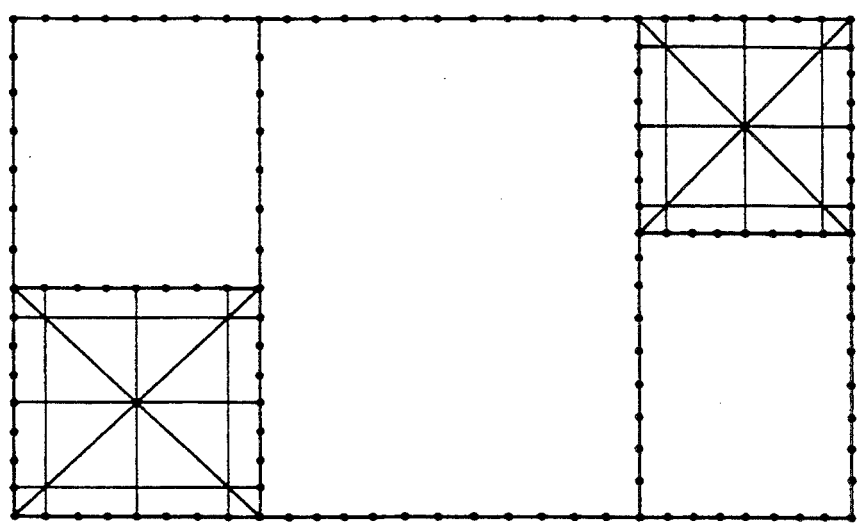
FIGS. 8(*a*) and 8(*b*) are wiring graphs used for the search of a pin placement.

FIG. 8(a) shows a layout model used in the initial pin placement. The wiring areas between the blocks use global wiring graphs Gr disclosed in the previously-mentioned documents 1. The graphs Gr correspond to parts of the respective edges which are divided at equal intervals H. The weight of each edge of the graphs Gr corresponds to the length H of the edge. It is assumed that, in a fixed-shape block, a pin is fixedly located at the closest vertex on the graph Gr.

Figure 8B:
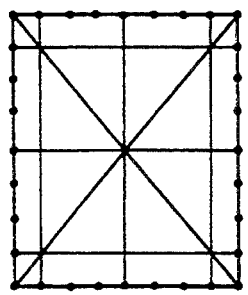
Figure 9A:
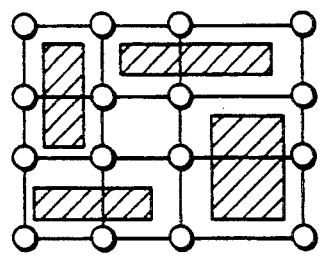
FIGS. 9(*a*), 9(*b*), 9(*c*), and 9(*d*) are diagrams showing examples of channel structures listed in a procedure "LST_NS&SL_STR".
Figure 9B:
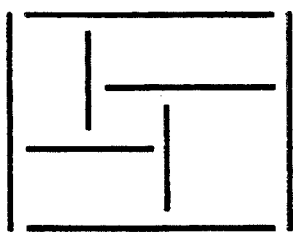
Figure 9C:
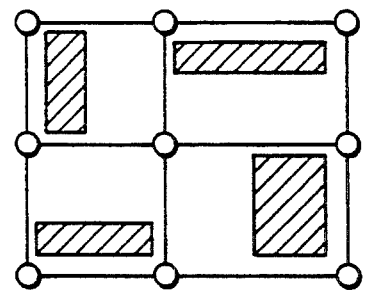
Figure 9D:
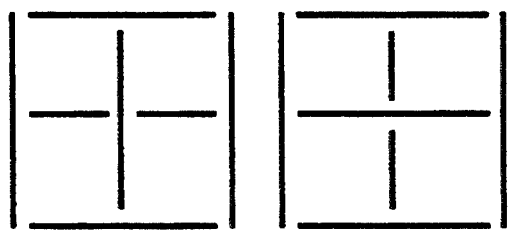

With respect to a shape-undefined block, as shown in FIG. 8(b), a vertex is located at the center of a rectangular area enclosing blocks and edges are added to the center of each edge of the blocks and the vertex on the graph Gr which is closest to the corner of the block. The weight of the added edge is set to a Manhattan distance "a". The distance "a" is a penalty assessing parameter which obstructs the movement of a search tree through a shape-undefined block, the search tree being used for determining pin placement. In order to express feed through paths, as shown in FIG. 8(b), edges are added to locations which are inwardly distant from the boundaries of the rectangular area, enclosing the blocks, by a distance H. The weight of the added edge is set to a Manhattan distance "b". The distance "b" is a penalty assessing parameter which obstructs the movement of a search tree through a shape-undefined block, the search tree being used for determining the pin placement. For each edge, the number of wirings which can pass through the edge has an upper limit. When the number of wirings passing through the edge exceeds the upper limit, the value "b" is set as b=100.0.

The pin placement is determined by route search on the graph Gr' formed as described previously. A brief description will be made hereinafter of the process for each net "n".

Firstly, the condition "a=1.1 and b=1.1" is set, and a minimal Steiner tree T on the graph Gr' is determined. An object of the tree T is to determine the area where the pins are placed for minimizing the wiring route length.

Secondly, the character T' is introduced to represent a graph which results from the addition of all of the vertices contained in the Steiner tree T, all of the vertices corresponding to the wiring areas at the boundaries and the centers of all the shape-undefined blocks having connection pins in the previously-mentioned nets, and the edges on the graph Gr' between the vertices, to the Steiner tree T.

Thirdly, the condition "a=0 and b=1.1" is set, and a minimal Steiner tree T" on the graph T' is determined. The initial locations of the pins of each shape-undefined block are set to vertices selected from the vertices corresponding to the peripheries of the shape-undefined block, the selected vertices adjoining the vertex corresponding to the center of the shape-undefined block and the edges of the minimal Steiner tree T".

Next, in view of the fact that the concentration of pins on a partial area (a vertex of the graph Gr) causes an increase in the chip size, an upper limit is set on the number of pins which can be placed in each area (each vertex of the graph Gr). When the number of pins of an area exceeds the upper limit, the surplus number of the pins are moved to another area or other areas which are close to the former area and which have a smaller number of pins than the upper limit. It should be noted that the pins related to the critical path nets are not moved from the initial locations.

DESCRIPTION OF THE SECOND PREFERRED EMBODIMENT

A second embodiment of this invention is similar to the first embodiment except for design changes indicated hereinafter. While the procedure LST_STR in the channel structure listing phase can deal with only the placement of the slicing structures in the first embodiment, the second embodiment is improved so that the non-slicing structures are also listed.

Figure 3:
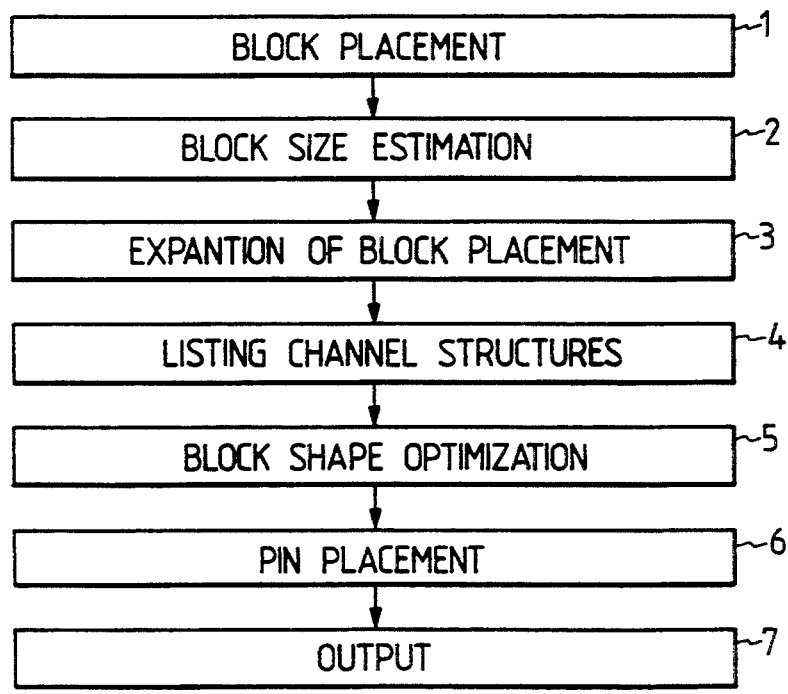
FIG. 3 is a flowchart of a program in this invention.

While the flow of the whole process of the second embodiment is similar to the previously-mentioned flow of FIG. 3, the contents of the block placement expansion means 3, the channel structure listing means 4, and the block shape optimization means 5 of the second embodiment differ from those of the first embodiment.

In the block placement expansion means. 3, it is unnecessary to provide a process of expanding the block placement to a degree at which a slice is allowed. Therefore, the block displacement is expanded at first until the overlaps between the blocks disappear. Then, the block displacement is expanded in accordance with the degree of expansion which is set from the exterior.

The channel structure listing means 4 uses a procedure LIST_STRUCTURE2 which searches only non-slicing structures for the placement of the non-slicing structures and which searches only slicing structures for the placement of the slicing structures.

A rough flow of the process in the procedure LIST_NS&SL_STRUCTURE of the channel structure listing means 4 will be indicated hereinafter.

In the procedure LIST_NS&SL_STRUCTURE, A is a rectangle area where all blocks are placed. Gz is an area representation graph based on the placement of blocks in area A. A* and G are a rectangle area and a graph, initially A*=A and G=Gz. STR_LST is a list of slicing structures. Initial state of the list STR_LST is empty.

Figure 10:
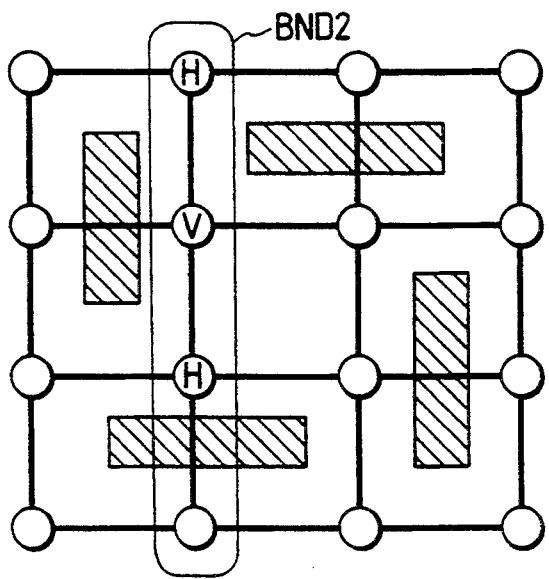
FIG. 10 is a diagram of a boundary which correspond to a non-slicing line searched in a procedure "LST_NS_STR".

Procedure LIST_NS&SL_STRUCTURE
  begin;
  Make area reprezentation graph Gz;
  Invoke LIST_STRUCTURE2(A*, G);
  If no slicing structure is taken from the given placement of blocks then;
    a=1;
    Invoke EXPND(A*, G, a);
    Invoke LIST_STRUCTURE2(A*, G);
  end;
Procedure LIST_STRUCTURE2(A*, G)
  begin;
    If there is no slice on the graph G then;
    Invoke LIST_NS_STRUCTURE(A*, G);
    else;
    Invoke LIST_SL_STRUCTURE(A*, G);
  end;
Procedure LIST_NS_STRUCTURE
  begin;
  Select a cut line BND2 which minimizes the number of crossing blocks, among such cut lines that one end of edge crosses no block. An example of cut line BND2 is shown in FIG. 10;
  If BND2 is horizontal cut line then;
    Divide the area A* by the cut line BND2 into the upper area A1 and the lower one A2;
    Let graphs G1 and G2 be sub graphs of Gz, each of which represent the block placement in A1 and A2, respectively;
    For all vertices v on the cut line BND2 other than both end vertecies of an edge crossing a block, if D(v)=nil then let D(v)='H', for other vertices v, if D(v)=nil then let D(v)='V';
    Invoke LIST_STRUCTURE2(A1, G1);
    Invoke LIST_STRUCTURE2(A2, G2);
  else;
    Divide the area A* by the cut line BND2 into the right area A1 and the left one A2;
    Let graphs G1 and G2 be sub graphs of Gz, each of which represent the block placement in A1 and A2, respectively;
    For all vertices v on the cut line BND2 other than both end vertecies of an edge crossing a block, if D(v)=nil then let D(v)='V', for other vertices v, if D(v)=nil then let D(v)='H';
    Invoke LIST_STRUCTURE2(A1, G1);
    Invoke LIST_STRUCTURE2(A2, G2);
  end;

In the case where the slicing structures are given, the block shape optimization means 5 is similar to that of the first embodiment. In the case where the non-slicing structures are given, a procedure CNSTRCT_NS_R(C,A) indicated below is used in place of the procedure CNSTRCT_SL_R(C,A). In the procedure CNSTRCT_NS_R(C,A), the character K denotes a parameter controlling the number of times of the execution of a loop. The value K is provisionally set to 100.

Procedure CNSTRCT_SL R(C,A)
1: Continue the following processes a K number of consecutive times until there is no decrease in an area A.
  1.1: Select one of the following operations OP1, OP2, and OP3 at random and apply the selected operation to each rectangular area Ai within the area A.
    OP1: Increase a width of the shape of an area Ai by a unit.
    OP2: Increase a height of the shape of an area Ai by a unit.
    OP3: Hold the shape of an area Ai unchanged.
  1.2: When the area A is decreased as a result of the step 1.1, accept the operation of the step 1.1. In other cases, cancel the operation of the step 1.1.
  1.3: Represent the relation between the shape "F0=(X0,Y0)" of the area A and the shape of each area Ai by the character "R(C,F0)".
2.1: X=X0
2.2: While the condition "Xj<a*Yj" (the character "a" denotes an upper limit of an allowable aspect ratio) remains satisfied, execute the following steps.
  2.1: X=X*1.1
  2.2: Continue the following processes a K number of consecutive times until there is no decrease in the area A.
    2.2.1: Select one of the following operations OP1, OP2, and OP3 at random and apply the selected operation to each rectangular area Ai within the area A.
      0P1: Increase a width of the shape of an area Ai by a unit.
      0P2: Increase a height of the shape of an area Ai by a unit.
      OP3: Hold the shape of an area Ai unchanged.
    2.2.2: In cases where the width of the area A does not exceed the value X and the area A is decreased as a result of the step 2.2.1, accept the operation of the step 2.2.1. In other cases, cancel the operation of the step 2.2.1.
    2.2.3: Represent the relation between the shape "Fj=(Xj,Yj)" of the area A and the shape of each area Ai by the character "R(C,Fj)".
3.1: X=X0
3.2: While the condition "Xj<a*Yj" (the character "a" denotes an upper limit of an allowable aspect ratio) remains satisfied, execute the following steps.
  3.1: X=X/1.1
  3.2: Continue the following processes a K number of consecutive times until there is no decrease in the area A.
    3.2.1: Select one of the following operations OP1, OP2, and OP3 at random and apply the selected operation to each rectangular area Ai within the area A.
      OP1: Increase a width of the shape of an area Ai by a unit.
      OP2: Increase a height of the shape of an area Ai by a unit.
      OP3: Hold the shape of an area Ai unchanged.
    3.2.2: In cases where the width of the area A does not exceed the value X and the area A is decreased as a result of the step 3.2.1, accept the operation of the step 3.2.1. In other cases, cancel the operation of the step 3.2.1.
    3.2.3: Represent the relation between the shape "Fj=(Xj,Yj)" of the area A and the shape of each area Ai by the character "R(C,Fj)".

DESCRIPTION OF THE THIRD PREFERRED EMBODIMENT

A third embodiment of this invention is similar to the first embodiment except for design changes indicated hereinafter. In the third embodiment, the channel structure listing phase 4 and the block phase optimization phase 5 are performed concurrently. Data structures where an area representation graph is made hierarchical are introduced into the third embodiment, and the listing of channel structures and the optimization of block shapes are performed by use of the graph.

Figure 11A:
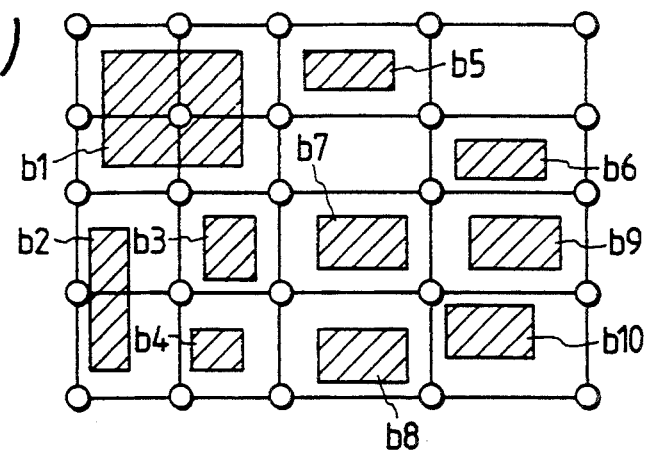
FIGS. 11(*a*), 11(*b*), 11(*c*), and 11(*d*) are diagrams showing a hierarchical area representation.
Figure 11B:
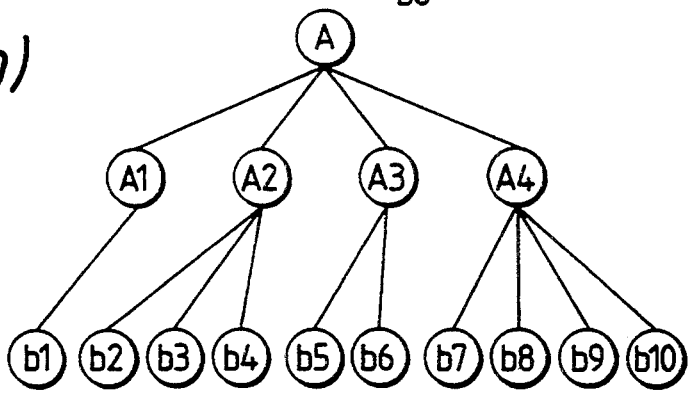
Figure 11C:
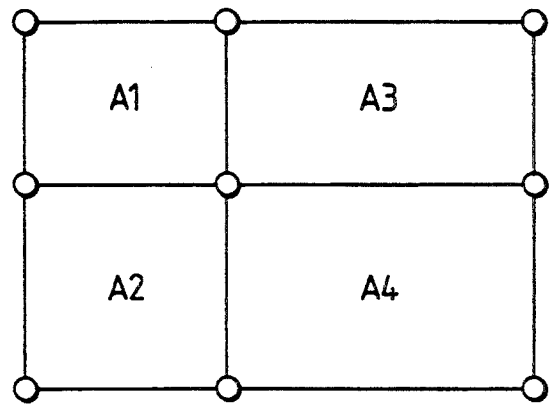
Figure 11D:
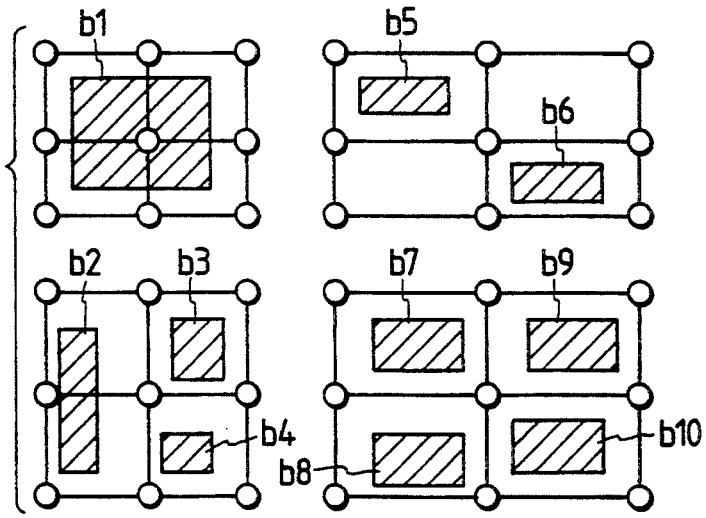

This embodiment uses an area representation graph where a rectangular area enclosing all blocks is expressed in a hierarchical manner by use of a technique such that rectangular areas each enclosing a plurality of blocks are provided in intermediate hierarchies and that a rectangular area enclosing some of the former rectangular areas is provided as a high hierarchy. For example, the area representation graph of FIG. 11(a) is converted, in accordance with the hierarchical structure of FIG. 11(b), into area representation graphs of FIGS. 11(c) and 11(d) which correspond to respective hierarchies.

During the processes of the channel structure listing phase and the block shape optimization phase, an area in which blocks are placed is divided hierarchically, and then a procedure "AREA_DIV_SL" is executed which makes hierarchical area representation graphs in accordance with the division. Next, a procedure "H_B-S_OPT" is performed which hierarchically optimizes the block shapes by use of the hierarchical area representation graphs.

The procedure "AREA_DIV_SL" will be described hereinafter. This procedure performs a division so that the number of sons of each hierarchy will be equal to or less than the value K (K=6). In this procedure, the character A denotes an area in which blocks are placed.

Procedure AREA_DIV_SL(A)

1: When the number of blocks contained in the area A is equal to or less than the value K, end the procedure.
2: Generate an area representation graph Gz on the basis of the placement of the blocks in the area A.
3: List all slices on the area representation graph Gz. In the absence of any slice, expand the block placement until a slice can be obtained. Then, list the obtained slice.
4: Among the listed slices "s", select an L (L=3) number of slices which have the first greatest, the second greatest, and the third greatest values e(s) respectively. Divide the area A with the selected slices into areas A1, A2, ..., Ak. Generate an area representation graph Gz(A) on the basis of the placement of the areas A1, A2, ..., Ak. Call a procedure "AREA_DIV_SL(Ai)" for each area Ai (i=1, 2, .. ., k).
5: End the procedure.

The procedure "H_BS_OPT" will be described hereinafter.

Procedure H_BS_OPT

1: For each area A of the lowest hierarchy, use the following processes and thereby determine a relation "R(C,Fi)" between the channel structures and the shapes which should be taken by the blocks in the area A to realize each of allowable shapes "Fi=(XiA,YiA) (i=1,2,...,m) of the area A. Set a condition as "if XiA<XjA, YiA>YjA.
1.1: List channel structures which represent the displacement of blocks in the area A. The procedure "LST_SL_STR" is used in this process.
1.2: For each channel structure C, perform the following step.
1.2.1: Determine a relation "R(C,Fi)" between allowable shapes "Fi=(XiA,YiA)" of the area A and the shapes which should be taken by the blocks in the area A to realize each of the allowable shapes. In cases where two shapes "(XiA,YiA)" and "(XjA,YjA)" which satisfy the condition "XiA<XjA and YiA<YjA" are allowed, delete the shape "(XjA,YjA)" from the shape list.
2: Define the highest hierarchy of the hierarchical area representation graph as a level 1 and define the lowest hierarchy as a level L*, and perform the following steps for the levels L=L* to 1.
2.1: List channel structures which represent the displacement of level-L areas in an area A' of a hierarchy of a level "L-1". The procedure "LST_S-L_STR" is used in this process.
2.2: For each channel structure C', perform the following step.
2.2.1: Determine a relation "R(C',F')" between allowable shapes of the area A' of the hierarchy of the level "L-1" and shapes "F'=(XiA',YiA')" which should be taken by the level-L areas in the area A' to realize each of the allowable shapes. In cases where two shapes "(XiA',YiA')" and "(XjA',YjA')" which satisfy the condition "XiA'<XjA' and YiA'<YjA'" are allowed, delete the shape "(XjA',YjA')" from the shape list.
3: Select one shape F from allowable shapes of the level-1 (chip) rectangular area in accordance with usefulness specifications such as minimization of size.
4: Output the shapes of the respective blocks which realize the chip shape, and the channel structures in the respective hierarchies.

In the previously-mentioned procedures, since the listing of the channel structures is performed for each hierarchy, the listed number is "(b/k)*$M^k$" where the letter "b" denotes the number of the blocks, and the letters "k" and "M" are constants equal to 6 and 3 respectively. Therefore, the order of the listed number equals "o(b)".

What is claimed is:

1. A computer implemented method of optimizing the shapes of blocks on an integrated circuit chip wherein blocks Ai (i=1,2, ... ,k) are placed in an area A on the integrated circuit chip in a non-slicing configuration on the chip, at least some of the blocks having variable shapes, the method comprising the steps of:
using computer means to:
perform, with respect to at least one block having a variable shape, a step of varying the shape thereof by randomly performing one of the steps of (a) increasing a selected value for the width of a block Ai (i=1,2, ... ,k), and (b) increasing a selected value for the height of the block;
then, to evaluate one of (a) the area size and width of the area and (b) the area size and height of the area A after the performing step;
to accept or reject the increase of (a) or (b) in accordance with the evaluation;
to determine a relation between a shape of the area A and shapes of the blocks Ai (i=1,2, ... ,k) in the area A on the basis of the previously mentioned steps; and
to determine a combination of optimal block shapes by use of the shape relation.

2. A computer implemented method of optimizing shapes of blocks including standard cells in a block placement of a slicing channel structure on a semiconductor chip, at least some of the blocks having variable shapes, comprising the steps of using a computer means for:

preliminarily positioning unit size representations of the blocks;

estimating final shapes of the blocks;

listing a plurality of different slicing channel structures, less than all possible slicing channel structures, in accordance with the estimated final shapes of the blocks;

providing optimal block shapes for each listed structure; and selecting an optimal configuration of blocks for placement on the semiconductor chip.

3. The method of claim 2 wherein said step of providing optimal block shapes comprises incrementally varying a shape of at least one variable shape block by incrementing a length dimension of one side thereof thereby providing a proposed block shape therefor.

4. The method of claim 3, wherein said step of incrementing a length dimension of one side of said variable shape block comprises changing said length dimension of said one side in accordance with a number of rows of standard cells included in the block.

5. The method of claim 3, wherein said step of incrementing a length dimension of one side of said variable shape block comprises changing said length dimension of said one side in accordance with at least one of a plurality of characteristics of standard cells included in the block, including: a height of a standard cell, a sum of cell widths, and a number of standard cells in the block.

6. The method of claim 3, wherein said step of incrementing a length dimension of one side comprises incrementally varying either a width or a height dimension of said at least one variable block, comparing a resulting aspect ratio of said at least one variable block with a predetermined upper limit for acceptable aspect ratio, and rejecting the proposed block shape if the resulting aspect ratio exceeds said predetermined upper limit.

7. The method of claim 6, wherein said step of incrementing a length dimension further comprises varying the other of said width or height dimension of said at least one variable block to maintain an area of said at least one variable block substantially constant.

8. The method of claim 3, wherein said step of incrementally varying a shape of at least one variable shape block comprises changing a length dimension of a second side of said at least one variable block to maintain an area of said at least one variable block substantially constant.

9. The method of claim 2, wherein said step of estimating final shapes of the blocks comprises, for at least one block having a variable shape:

selecting a number, R, of rows of standard cells for inclusion in said at least one block; defining parameters "a", "b", "c", and "d"; and defining a height dimension Y and a width dimension X of said at least one variable shape block;

varying an estimated shape of said at least one variable shape block by setting said height dimension Y and said width dimension X of said at least one variable shape block in accordance with a relation "Y=a*R+b" and "X=c/R+d".

10. The method of claim 2, wherein said step of estimating final shapes of the blocks comprises:

selecting a number, R, of rows of standard cells for inclusion in a block; defining parameters "a", "b", "c", and "d"; and defining a height dimension Y and a width dimension X of said block;

establishing an estimated shape of said block by setting said height dimension Y and said width dimension X thereof in accordance with a relation "Y=a*R+b" and "X=c/R+d";

actually placing standard cells on the chip and wiring the cells in R rows in accordance with said relation; and determining values of the parameters "a", "b", "c", and "d" in accordance with the height and width of blocks obtained as a result of the actual placement and wiring of the blocks on the chip.

11. The method of claim 2 wherein said step of listing of a plurality of different slicing channel structures comprises identifying a minimal number of slicing channel structures for non-overlapping placement of blocks having the estimated final shapes.

12. The method of claim 11 wherein said step of providing optimal block shapes comprises incrementally varying a shape of at least one variable shape block by incrementing one of a length dimension and a width dimension thereof thereby providing a proposed block shape therefor.

13. The method of claim 12, wherein said step of incrementing one of a length dimension and a width dimension comprises changing the dimension in accordance with a number of rows of standard cells included in the block.

14. The method of claim 12, wherein said step of incrementing one of a length dimension and a width dimension comprises changing the dimension in accordance with at least one of a plurality of characteristics of standard cells included in the block, including: a height of a standard cell, a sum of cell widths, and a number of standard cells in the block.

15. The method of claim 12, wherein said step of providing optimal block shapes further comprises changing the other of a said length dimension and said width dimension of said at least one variable block to maintain an area of said at least one variable block substantially constant.

16. The method of claim 12, wherein said step of providing optimal block shapes further comprises comparing a resulting aspect ratio of said at least one variable block with a predetermined upper limit for acceptable aspect ratio, and rejecting the proposed block shape if the resulting aspect ratio exceeds said predetermined upper limit.

17. A computer implemented method of optimizing shapes of blocks including standard cells in a block placement of a slicing channel structure on a semiconductor chip, at least some of the blocks having variable shapes, comprising the steps of:

preliminarily positioning unit size blocks; and providing optimal block shapes for said unit size blocks to minimize a resultant chip size, wherein said step of providing optimal block shapes comprises eliminating dead space on the chip by varying a shape of at least one block $A_i$ ($i=1,2,\ldots,k$) having a variable shape, by randomly performing one of the steps of (a) increasing a selected value for a width of said at least one block, and (b) increasing a selected value for a height of said at least one block, thereby repeatedly changing an aspect ratio of said at least one block to eliminate dead space on the chip.

18. A method in accordance with claim 17 wherein said step of providing optimal block shapes further comprises providing optimal placement of said blocks by moving said unit size blocks in horizontal and vertical directions to establish different location combinations thereof;

for each of the different location combinations, optimizing the sizes and shapes of the unit size blocks to minimize chip area to provide a proposed final placement;

from the proposed final placements including optimized sizes and shapes for each of the different location combinations, selecting as a final placement the proposed final placement having the smallest total chip area.

19. A method in accordance with claim 18, comprising the further step of depositing on the chip the blocks with the optimized sizes and shapes at the locations selected in the selecting step.

20. The method of claim 18 wherein said step of optimizing includes rotating one of the blocks having an optimized size and shape by 90°.

21. The method of claim 18, wherein said step of providing optimal block shapes further comprises changing the other of said length dimension and said width dimension of said at least one block to maintain an area of said at least one block substantially constant by, upon randomly performing said one of the steps (a) and (b), correspondingly performing one of the steps of (a1) decreasing a selected value for a height of the block and (b1) decreasing a selected value for a width of the block, respectively.

22. The method of claim 18 wherein said step of optimizing includes moving one of the blocks having an optimized size in at least one of horizontal and vertical directions.

* * * * *